US006615311B2

United States Patent
Ramakrishnan

(10) Patent No.: US 6,615,311 B2
(45) Date of Patent: Sep. 2, 2003

(54) METHOD AND SYSTEM FOR UPDATING A CONTENT ADDRESSABLE MEMORY (CAM) THAT PRIORITIZES CAM ENTRIES ACCORDING TO PREFIX LENGTH

(75) Inventor: Balakrishnan Ramakrishnan, Sunnyvale, CA (US)

(73) Assignee: Riverstone Networks, Inc., Santa Clara, CA (US)

( * ) Notice: Subject to any disclaimer, the term of this patent is extended or adjusted under 35 U.S.C. 154(b) by 299 days.

(21) Appl. No.: 09/876,499

(22) Filed: Jun. 7, 2001

(65) Prior Publication Data

US 2002/0188799 A1 Dec. 12, 2002

(51) Int. Cl.[7] ............................................... G06F 12/00
(52) U.S. Cl. ..................... 711/108; 711/156; 711/212; 711/214; 711/217; 365/49; 707/6
(58) Field of Search ................................ 711/108, 156, 711/212, 214, 217; 365/49; 707/6

(56) References Cited

U.S. PATENT DOCUMENTS

| | | | |
|---|---|---|---|
| 5,920,886 A | | 7/1999 | Feldmeier ................... 711/108 |
| 6,052,683 A | | 4/2000 | Irwin ............................ 707/8 |
| 6,081,440 A | | 6/2000 | Washburn et al. ............. 365/49 |
| 6,134,135 A | | 10/2000 | Andersson .................... 365/49 |
| 6,154,384 A | * | 11/2000 | Nataraj et al. ................. 365/49 |
| 6,289,414 B1 | * | 9/2001 | Feldmeier et al. .......... 711/108 |
| 6,539,455 B1 | * | 3/2003 | Khanna et al. ............. 711/108 |

OTHER PUBLICATIONS

Music Semiconductors, Application Brief AB–N12, "Using the MU9C1965A/L LANCAM MP in LAN–ATM Edge Switches," pp 1–4, Sep. 30, 1998.*

Music Semiconductors, Application Brief AB–N13, "VPI/VCI Translation and Cell Tagging in ATM with the MU9C4320L ATMCAM," pp 1–12, Sep. 30, 1998.*

Music Semiconductors, Application Brief AB–N15, "Using the MUSIC ATMCAM," pp 1–20, Sep. 30, 1998.*

Netlogic Microsystems, Application Note NCS05, Revision 1.5, "CIDR Longest Prefix Matching in Network Search Engines," pp 1–4, Mar. 2001.*

McAuley et al., "Fast Routing Table Lookup Using CAMs," pp 1382–1391, IEEE, 1993.*

Music Semiconductors, What Is A CAM (Content–Addressable Memory)?, Application Brief AB–N6, Sep. 30, 1998, Rev. 2a.

Music Semiconductors, Advantage of CAM in ASIC–Based Network Address Processing, Application Brief AB–N11, Sep. 30, 1998 Rev. 1.2a Draft.

Ichiru, Mike, Netlogic Microsystems, High Performance Layer 3 Forwarding The Need for Dedicated Hardware Solutions, 2000.

Netlogic Microsystems, Using the NSE1004 Network Search Engine for Longest Prefix Match, Application Note NCS05, undated.

* cited by examiner

Primary Examiner—Kevin L. Ellis
Assistant Examiner—Stephen Elmore
(74) Attorney, Agent, or Firm—Mark Wilson

(57) ABSTRACT

Updating a content addressable memory (CAM) involves identifying a new entry that is to be added to the CAM, identifying a free location in the CAM that is the fewest number of prefix levels away from the prefix level of the new entry, moving an existing CAM entry into the free location to create a newly freed location that is a fewer number of prefix levels away from the prefix level of the new entry, repeating the move process until a free location is created at the desired prefix level of the new entry, and then adding the new entry into the newly freed location. The specific algorithm for moving entries to free a location in the desired prefix level is a function of whether the prefix level of the first free location is above or below the prefix level of the new entry.

29 Claims, 10 Drawing Sheets

| CAM index | DA/prefix length |
|---|---|
| 0 | 40.1.2.1/31 |
| 1 | 20.3.1.1/31 |
| 2 | 50.1.1.4/31 |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.5/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

CAM snapshot
Need to add 100.1.1.1/23

FIG. 5

| CAM index | DA/prefix length | |
|---|---|---|
| 0 | 40.1.2.1/31 | |
| 1 | 20.3.1.1/31 | |
| 2 | 50.1.1.4/31 | |
| 3 | Free | |
| 4 | Free | |
| 5 | 32.1.2.3/23 | |
| 6 | 12.1.1.2/23 | |
| 7 | 100.1.1.1/23 | Added |
| 8 | 190.3.2.1/20 | |
| 9 | 95.5.7.6/15 | |
| 10 | 99.1.3.2/15 | |
| 11 | 87.9.1.1/10 | |
| 12 | 34.2.3.4/10 | |
| 13 | 3.4.2.1/8 | |
| 14 | 1.2.3.4/8 | |
| 15 | Free | |
| 16 | 1.1.1.1/6 | |
| 17 | 2.2.2.2/0 | |

After adding 100.1.1.1/23

FIG. 6

| Prefix level | Total number of locations in prefix level | Number of entries in prefix level | CAM start index of prefix level |
|---|---|---|---|
| 31 | 5 | 3 | 0 |
| 23 | 3 | 2 → 3 | 5 |
| 20 | 1 | 1 | 8 |
| 15 | 2 | 2 | 9 |
| 10 | 2 | 2 | 11 |
| 8 | 3 | 2 | 13 |
| 6 | 1 | 1 | 16 |
| 0 | 1 | 1 | 17 |

CAM data structure update

FIG. 7

| CAM index | DA/prefix length |
|---|---|
| 0 | 40.1.2.1/31 |
| 1 | 20.3.1.1/31 |
| 2 | 50.1.1.4/31 |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.6/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

CAM snapshot
Need to add 175.1.1.1/15

FIG. 8

| CAM index | DA/prefix length | |
|---|---|---|
| 0 | 40.1.2.1/31 | |
| 1 | 20.3.1.1/31 | |
| 2 | 50.1.1.4/31 | |
| 3 | Free | |
| 4 | Free | |
| 5 | 32.1.2.3/23 | |
| 6 | 12.1.1.2/23 | |
| 7 | 190.3.2.1/20 | Moved |
| 8 | 175.1.1.1/15 | added |
| 9 | 95.5.7.6/15 | |
| 10 | 99.1.3.2/15 | |
| 11 | 87.9.1.1/10 | |
| 12 | 34.2.3.4/10 | |
| 13 | 3.4.2.1/8 | |
| 14 | 1.2.3.4/8 | |
| 15 | Free | |
| 16 | 1.1.1.1/6 | |
| 17 | 2.2.2.2/0 | |

After adding 175.1.1.1/15

FIG. 9

| Prefix level | Total number of locations in prefix level | Number of entries in prefix level | CAM start index of prefix level |
|---|---|---|---|
| 31 | 5 | 3 | 0 |
| 23 | 3 → 2 | 2 | 5 |
| 20 | 1 | 1 | 8 → 7 |
| 15 | 2 → 3 | 2 → 3 | 9 → 8 |
| 10 | 2 | 2 | 11 |
| 8 | 3 | 2 | 13 |
| 6 | 1 | 1 | 16 |
| 0 | 1 | 1 | 17 |

CAM data structure update

FIG. 10

| CAM index | DA/prefix length |
|---|---|
| 0 | 40.1.2.1/31 |
| 1 | 20.3.1.1/31 |
| 2 | 50.1.1.4/31 |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.6/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

CAM snapshot
Need to add 120.1.2.3/10

FIG. 11

| CAM index | DA/prefix length | |
|---|---|---|
| 0 | 40.1.2.1/31 | |
| 1 | 20.3.1.1/31 | |
| 2 | 50.1.1.4/31 | |
| 3 | Free | |
| 4 | Free | |
| 5 | 32.1.2.3/23 | |
| 6 | 12.1.1.2/23 | |
| 7 | Free | |
| 8 | 190.3.2.1/20 | |
| 9 | 95.5.7.6/15 | |
| 10 | 99.1.3.2/15 | |
| 11 | 87.9.1.1/10 | |
| 12 | 34.2.3.4/10 | |
| 13 | 120.1.2.3/10 | Added |
| 14 | 1.2.3.4/8 | |
| 15 | 3.4.2.1/8 | Moved |
| 16 | 1.1.1.1/6 | |
| 17 | 2.2.2.2/0 | |

After adding 120.1.2.3/10

FIG. 12

| Prefix level | Total number of locations in prefix level | Number of entries in prefix level | CAM start index of prefix level |
|---|---|---|---|
| 31 | 5 | 3 | 0 |
| 23 | 3 | 2 | 5 |
| 20 | 1 | 1 | 8 |
| 15 | 2 | 2 | 9 |
| 10 | 2 → 3 | 2 → 3 | 11 |
| 8 | 3 → 2 | 2 | 13 → 14 |
| 6 | 1 | 1 | 16 |
| 0 | 1 | 1 | 17 |

CAM data structure update

FIG. 13

| CAM index | DA/prefix length |
|---|---|
| 0 | 40.1.2.1/31 |
| 1 | 20.3.1.1/31 |
| 2 | 50.1.1.4/31 |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.6/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

CAM snapshot
Need to delete 34.2.3.4/10

FIG. 14

| CAM index | DA/prefix length | |
|---|---|---|
| 0 | 40.1.2.1/31 | |
| 1 | 20.3.1.1/31 | |
| 2 | 50.1.1.4/31 | |
| 3 | Free | |
| 4 | Free | |
| 5 | 32.1.2.3/23 | |
| 6 | 12.1.1.2/23 | |
| 7 | 100.1.1.1/23 | |
| 8 | 190.3.2.1/20 | |
| 9 | 95.5.7.6/15 | |
| 10 | 99.1.3.2/15 | |
| 11 | 87.9.1.1/10 | |
| 12 | Free | Deleted |
| 13 | 3.4.2.1/8 | |
| 14 | 1.2.3.4/8 | |
| 15 | Free | |
| 16 | 1.1.1.1/6 | |
| 17 | 2.2.2.2/0 | |

After deleting 34.2.3.4/10

FIG. 15

| Prefix level | Total number of locations in prefix level | Number of entries in prefix level | CAM start index of prefix level |
|---|---|---|---|
| 31 | 5 | 3 | 0 |
| 23 | 3 | 2 | 5 |
| 20 | 1 | 1 | 8 |
| 15 | 2 | 2 | 9 |
| 10 | 2 | 2 → 1 | 11 |
| 8 | 3 | 2 | 13 |
| 6 | 1 | 1 | 16 |
| 0 | 1 | 1 | 17 |

CAM data structure update

FIG. 16

| CAM index | DA/prefix length |
|---|---|
| 0 | 40.1.2.1/3 |
| 1 | 20.3.1.1/31 |
| 2 | 50.1.1.4/31 |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.6/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

CAM snapshot
Need to deleted 40.1.2.1/31

FIG. 17

| CAM index | DA/prefix length |
|---|---|
| 0 | 50.1.1.4/31 | Moved
| 1 | 20.3.1.1/31 |
| 2 | Free |
| 3 | Free |
| 4 | Free |
| 5 | 32.1.2.3/23 |
| 6 | 12.1.1.2/23 |
| 7 | Free |
| 8 | 190.3.2.1/20 |
| 9 | 95.5.7.6/15 |
| 10 | 99.1.3.2/15 |
| 11 | 87.9.1.1/10 |
| 12 | 34.2.3.4/10 |
| 13 | 3.4.2.1/8 |
| 14 | 1.2.3.4/8 |
| 15 | Free |
| 16 | 1.1.1.1/6 |
| 17 | 2.2.2.2/0 |

After deleting 40.1.2.1/31

FIG. 18

| Prefix level | Total number of locations in prefix level | Number of entries in prefix level | CAM start index of prefix level |
|---|---|---|---|
| 31 | 5 | 3 → 2 | 0 |
| 23 | 3 | 2 | 5 |
| 20 | 1 | 1 | 8 |
| 15 | 2 | 2 | 9 |
| 10 | 2 | 2 | 11 |
| 8 | 3 | 2 | 13 |
| 6 | 1 | 1 | 16 |
| 0 | 1 | 1 | 17 |

CAM data structure update

FIG. 19

Add x.x.x.x/23
(Free location above desired prefix level)

/31
/29
/free
/free
/28  ⟵ ① Move
/28
/28  ⟵ ② Move
/27
/26  ⟵ ③ Move
/26
/21  ⟵ ④ Insert
/20
/20
/20
/19
⋮

FIG. 20

Add x.x.x.x/23
(Free location below desired prefix level)

/31
/31
/27  ⟵ ⑤ Insert
/27
/21  ⟵ ④ Move
/20
/20  ⟵ ③ Move
/20
/16  ⟵ ② Move
/16
/15
/15  ⟵ ① Move
/gap
/gap
/13
⋮

FIG. 21

METHOD AND SYSTEM FOR UPDATING A CONTENT ADDRESSABLE MEMORY (CAM) THAT PRIORITIZES CAM ENTRIES ACCORDING TO PREFIX LENGTH

FIELD OF THE INVENTION

The invention relates generally to content addressable memory (CAM) and more particularly to a method and system for updating a CAM such that CAM entries are prioritized within the CAM according to their associated prefix lengths.

BACKGROUND OF THE INVENTION

Internet protocol (IP) routing involves transmitting packets from a source to a destination through a series of hops. Determining the next hop of a packet involves looking up the destination address of the packet in a route lookup table. The speed with which route lookups are performed is one factor that determines the throughput of a router. Traditional routers have used RAM and software based lookups to determine the next hop of packets, however, RAM and software based lookups have become a bottleneck in newer high speed routers.

CAM arrays are now being used as a way to speed route table lookups. Specifically, "ternary" or "tertiary" CAMs are being used to perform route table lookups in networks that require longest prefix matching, such as networks that utilize Classless Inter Domain Routing (CIDR). Ternary CAMs can perform compare operations on bits that are "0", "1", or "don't care". In order to accomplish compare operations on bits that are "0", "1", or "don't care", ternary CAMs store a prefix mask word in addition to a CAM entry word. The prefix mask word associated with each CAM entry indicates the number of significant bits that must be matched in each CAM entry. That is, the prefix mask word identifies the bits that fall into the "don't care" category.

CIDR specifies longest prefix matching and because multiple matches may occur in a route lookup, the longest prefix match must be determined from the multiple matches. The most common technique for determining the longest prefix match from multiple matches involves prioritizing all of the route entries in a lookup table by prefix length, with the longest prefix length having the highest priority and the shortest prefix length having the lowest priority. The longest prefix match is determined by selecting the matching entry with the highest priority among all of the matching entries.

Prioritizing the route entries within a CAM array involves sorting the route entries by prefix length and then storing the sorted route entries in indexed CAM locations. The priority order of the route entries must be maintained within the CAM array even as the CAM array is updated. Updating the CAM array in a manner that maintains the priority order of the route entries is time consuming and can offset the efficiencies that are gained by utilizing CAMs because the CAM array cannot be looked up by the hardware while it is being updated.

One technique for managing route entries within a CAM array involves leaving free locations within the CAM array at each prefix level so that new route entries can be written into the free locations without effecting the priority order of the other route entries. While leaving free locations at each prefix level works well to maintain the priority order of the CAM entries, it reduces the density of route entries that are stored within the CAM.

Another technique for updating a CAM array involves moving a block of the CAM entries in order to free a location for a new entry or to delete an existing entry. Moving large blocks of CAM entries is undesirable because each move consumes processor cycles that could be allocated to other critical operations.

Still another technique for updating a CAM array involves maintaining a bitmap or linked list of the free locations in the memory of a central processing unit (CPU) in order to find free locations. Maintaining a bitmap or linked list could involve significant CPU memory and hence is not desirable.

In view of the benefits provided by CAMs and the problems involved with updating CAM arrays to maintain the priority order of route entries within a CAM array, what is needed is an efficient technique for updating a CAM array that maintains the priority order of CAM entries.

SUMMARY OF THE INVENTION

A method and system for updating a CAM involves identifying a new entry that is to be added to the CAM, identifying a free location in the CAM that is the fewest number of prefix levels away from the prefix level of the new entry, moving an existing CAM entry into the free location to create a newly freed location that is a fewer number of prefix levels away from the prefix level of the new entry, repeating the move process until a free location is created at the desired prefix level of the new entry, and then adding the new entry into the newly freed location. The specific algorithm for moving entries to free a location in the desired prefix level is a function of whether the prefix level of the first free location is above or below the prefix level of the new entry.

If the prefix level of the first free location is above the prefix level of the new entry, then the technique involves moving the bottom entry from a prefix level that is one prefix level below the prefix level with the free location to the bottom most free location of the prefix level with the free location, thereby consuming the bottom most free location in the prefix level with the free location and creating a newly freed location in a prefix level that is a fewer number of prefix levels away from the desired prefix level. The process is repeated until a free location is created at the desired prefix level.

If the prefix level of the first free location is below the prefix level of the new entry, then the technique involves moving the entry at the top of the prefix level with the free location to the first free location in the same prefix level, thereby creating a free location at the bottom of the next prefix level above. The process is repeated until a free location is created at the desired prefix level.

If free locations exist above and below the desired prefix level and the number of prefix levels above and below the desired prefix level is the same, then moves are made as if the prefix level of the first free location is above the prefix level of the new entry.

The technique for updating a CAM involves creating a free location, sequentially one prefix level at a time, from the initial prefix level to the desired prefix level and the technique requires only one move within each prefix level that separates the desired prefix level from the prefix level with the first free location. Because of the sequential nature of the moves, the priority order or the CAM entries is maintained and the number of moves is minimized. In addition, because the technique does not involve maintaining a bitmap or a linked list of free locations in CPU memory, CPU memory is conserved.

Other aspects and advantages of the present invention will become apparent from the following detailed description,

BRIEF DESCRIPTION OF THE DRAWINGS

FIG. 5 depicts a CAM snapshot of eighteen CAM locations in CAM array.

FIG. 6 depicts a CAM snapshot of the CAM locations in FIG. 5 after a new entry is added to the CAM array.

FIG. 7 depicts a CAM data structure that represents the change in status of the CAM array from FIG. 5 to FIG. 6.

FIG. 8 depicts a CAM snapshot of eighteen CAM locations in CAM array.

FIG. 9 depicts a CAM snapshot of the CAM locations in FIG. 8 after a new entry is added to the CAM array.

FIG. 10 depicts a CAM data structure that represents the change in status of the CAM array from FIG. 8 to FIG. 9.

FIG. 11 depicts a CAM snapshot of eighteen CAM locations in CAM array.

FIG. 12 depicts a CAM snapshot of the CAM locations in FIG. 11 after a new entry is added to the CAM array.

FIG. 13 depicts a CAM data structure that represents the change in status of the CAM array from FIG. 11 to FIG. 12.

FIG. 14 depicts a CAM snapshot of eighteen CAM locations in CAM array.

FIG. 15 depicts a CAM snapshot of the CAM location in FIG. 14 after an existing entry is deleted from the CAM array.

FIG. 16 depicts a CAM data structure that represents the change in status of the CAM array from FIG. 15 to FIG. 16.

FIG. 17 depicts a CAM snapshot of eighteen CAM locations in CAM array.

FIG. 18 depicts a CAM snapshot of the CAM location in FIG. 17 after an existing entry is deleted from the CAM array.

FIG. 19 depicts a CAM data structure that represents the change in status of the CAM array from FIG. 17 to FIG. 18.

FIG. 20 depicts and example add operation that follows the process flow depicted in FIGS. 4A and 4B, where the closest free location to a desired prefix level is at a prefix level that is above the desired prefix level.

FIG. 21 depicts and example add operation that follows the process flow depicted in FIGS. 4A and 4B, where the closest free location to a desired prefix level is at a prefix level that is below the desired prefix level.

DETAILED DESCRIPTION OF THE INVENTION

Figure 1:
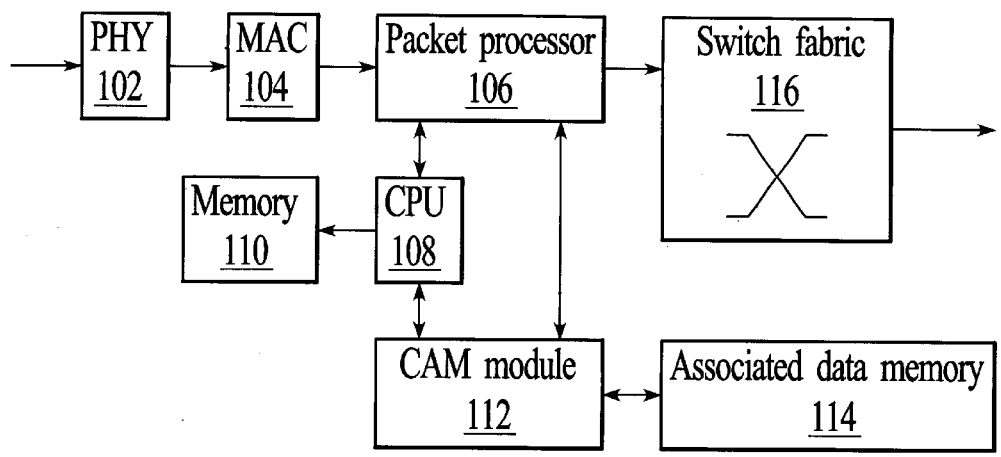
FIG. 1 depicts relevant functional blocks of a network node that utilizes a CAM module for route lookups.

FIG. 1 depicts relevant functional blocks of a network node, such as a switch or a router, that forwards packets within a network. The network node depicted in FIG. 3 includes a PHY 102, a MAC 104, a packet processor 106, a CPU 108, memory 110, a CAM module 112, an associated data memory 114, and a switch fabric 116. In an embodiment, the network node is an Ethernet-based switch/router.

The PHY 102 is the physical interface between the incoming signals and the network node. In an embodiment that includes an optical connection, the PHY converts incoming light pulses into electrical signals and then identifies the incoming data segments, for example, incoming Ethernet frames. The PHY forwards the incoming data segments to the MAC 104. The PHY is a well known functional unit in switches and routers and is not described in further detail.

The MAC 104 manages the layer 2 addressing control for the network nodes. For bridged data segments (i.e., Ethernet frames), the MAC reads the layer 2 header of incoming data segments and performs layer 2 lookups to determine how to forward the incoming data segments to their next destination within the network node. For routed data segments (i.e., IP packets), the MAC forwards the data segments to the packet processor 106.

Figure 3:
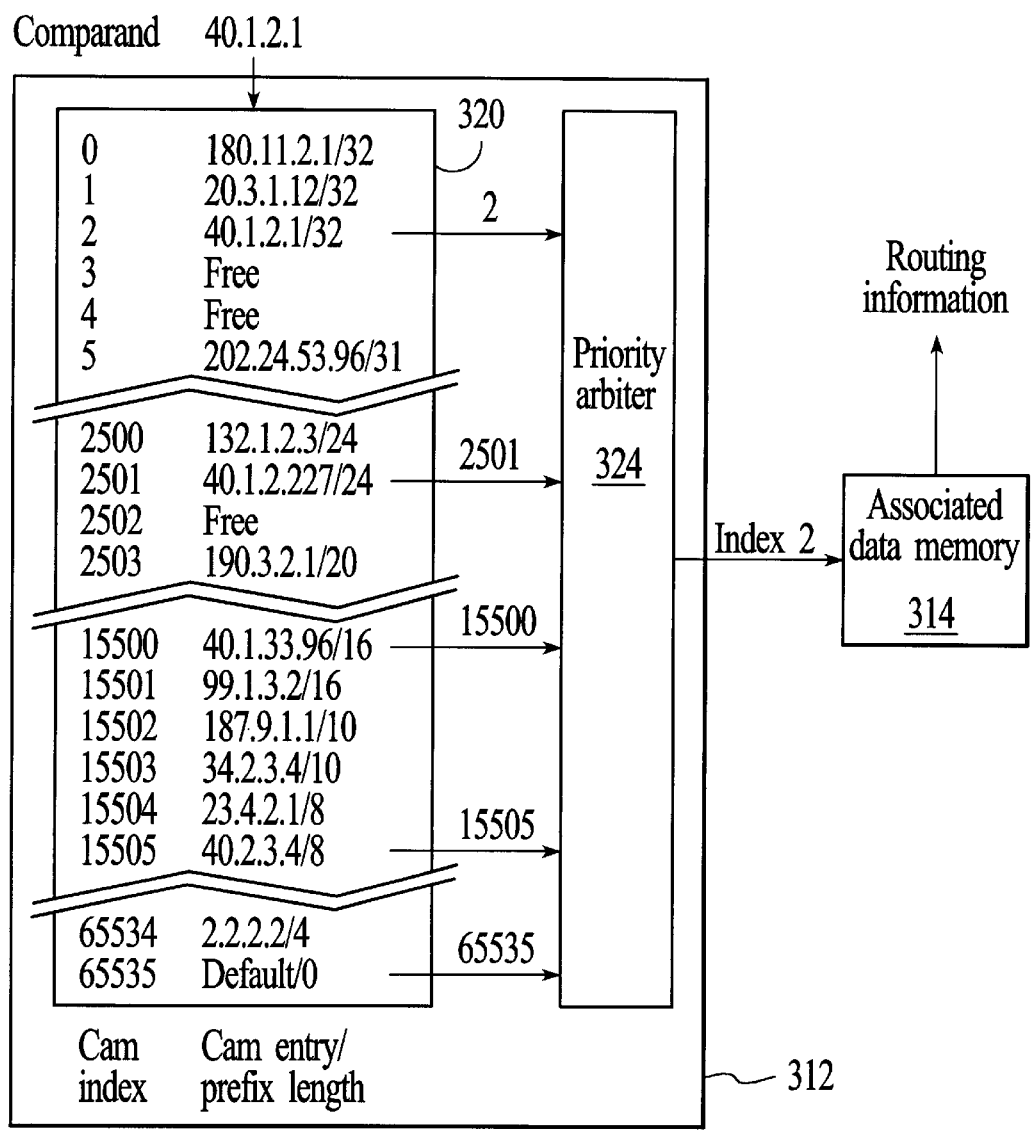
FIG. 3 depicts an example embodiment of a CAM array, a priority arbiter, and an associated data memory.

The packet processor 106 performs layer 3 address lookups for routed data segments (i.e., IP packets). As shown in FIG. 3, the packet processor is in communication with the CPU 108, the CAM module 112, and the associated data memory 114.

The CPU 108 is a multifunction processor that performs various management functions. In an embodiment, the PHY 102, MAC 104, packet processor 106, CPU 108, memory 110, CAM module 112, and associated data memory 114 are located on the same line card and the CPU handles control functions on the line card. The CPU implements software instructions. Software instructions that are implemented by the CPU may be stored in the memory 110. In an embodiment, the memory is DRAM memory that is accessible to the CPU. As is described below, the CPU provides instructions for updating the CAM array in a manner that maintains the priority order of CAM entries.

The CAM module 112 includes the route entries that are used to determine the next hop for routed packets and the associated data memory 114 includes information associated with the route entries that is needed to forward packets, such as exit port mapping and exit destination MAC addresses. In the case of multicast packets, route information includes multiple exit ports and multiple exit destination MAC addresses.

The switch fabric 116 creates a datapath between an input packet processor and an output packet processor. Switch fabrics that are utilized with Ethernet switch/routers are known in the field and may include shared memory, shared bus, and cross point matrices.

Figure 2:
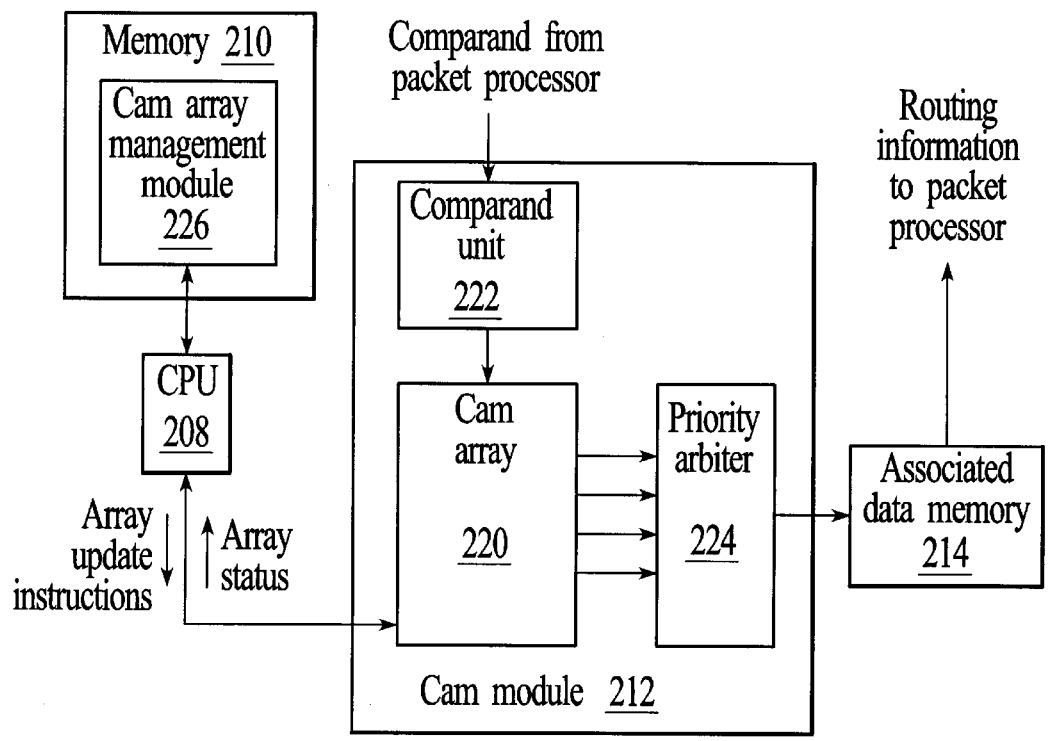
FIG. 2 is an expanded view of an embodiment of the CAM module shown in FIG. 1.

FIG. 2 is an expanded view of an embodiment of the CAM module 112 and memory 110 that are shown in FIG. 1. The CAM module 212 includes a CAM array 220, a comparand unit 222, and a priority arbiter 224, and the memory includes a CAM array management module 226. The CAM array stores the CAM entries in CAM locations. The CAM locations are typically organized in rows of individual CAM memory cells. Throughout this description, a CAM location includes a series of CAM memory cells that stores a CAM entry word and a CAM prefix mask word. Each CAM location is assigned a CAM index that identifies a series of CAM memory cells within the CAM array. In an embodiment, a CAM array has 64K CAM locations that are indexed from 0 to 65,535. The comparand unit provides a comparand to the CAM array. In an embodiment, the comparand is a destination IP address that is used to determine a next hop for an IP packet. The priority arbiter resolves multiple matches to determine the longest prefix match. The CAM array, comparand unit, and priority arbiter are known in the field.

The CAM array management module 226 manages the updating of the CAM array. The CAM array management module receives new CAM entries and CAM array status information and generates CAM array update instructions. The function of the CAM array management module is the focus of the invention that is described in detail below. In the embodiment of FIG. 2, the CAM array management module includes computer readable software code that is implemented by the CPU 208. Throughout the description, similar reference numerals may be used to identify similar elements.

FIG. 3 depicts an example embodiment of a CAM array 320, a priority arbiter 324, and an associated data memory 314. The CAM array is populated with example CAM entries that are used below to describe an example CAM lookup operation. Each CAM location of the CAM array has an associated CAM index. In the embodiment of FIG. 3, the CAM array includes 64K entries and the CAM index values range from 0 to 65,535, with CAM index 0 being at the "top" of the CAM array and CAM index 65,535 being at the "bottom" of the CAM array. The CAM array is populated with CAM entries, with each CAM entry having an associated prefix length (i.e., 180.11.2.1/32). The CAM entries and related prefix lengths are presented in the well known convention of CAM entry/prefix length. The CAM entries are grouped by prefix length into prefix levels within the CAM array and organized in numerical order according to prefix level. The prefix lengths of the CAM entries define the prefix levels within the CAM array. In the embodiment of FIG. 3, the entries at prefix level thirty-two (/32) are followed by the entries at prefix level thirty-one (/31) and so on. The longest prefix length is considered to have the highest priority and the priority of the CAM entries decreases as the prefix lengths decrease. In the embodiment of FIG. 3, the CAM locations are indexed from the longest prefix length (lowest CAM index number) to the shortest prefix length (highest CAM index numbers) although in other embodiments the CAM indexing can be reversed. In accordance with the invention, free locations in a prefix level are kept at the bottom of a prefix level and the first CAM entry below a free location is the top most entry in the next prefix level below, although this may be reversed. Although thirty-two prefix levels (plus the default prefix level) are available, every prefix level may not be represented by a CAM entry. For example, in the CAM array of FIG. 3, prefix level nine (/9) does not exist because there is not an entry with a prefix length of nine.

In a CAM lookup operation, a comparand is applied to the CAM array 320 and all of the CAM locations are simultaneously compared to the comparand for CAM entry matches. If no CAM entry matches are found, the CAM lookup operation is complete. If one CAM entry match is found, then the CAM array outputs a match signal that identifies the CAM index where the match was found. The CAM index is used to identify the associated routing information that is stored in the associated data memory.

If multiple CAM entry matches are found, multiple CAM index values are received by the priority arbiter 324. The priority arbiter compares the CAM index values and determines the highest priority match among the multiple matches. The highest priority match is the match with the lowest CAM index. FIG. 3 depicts a CAM lookup that has returned four CAM entry matches and a default match. The example CAM entry matches are at index numbers 2, 2,501, 15,500, and 15,505, and the default index 65,535. In the embodiment of FIG. 3, the match at CAM index 2 has the lowest CAM index and therefore is identified by the priority arbiter as the highest priority match. The highest priority match is then utilized to locate the related routing information that is stored in the associated data memory 314.

As described above, determining the longest prefix match from multiple CAM entry matches relies on the CAM entries being prioritized by prefix length. The algorithm described below with reference to FIGS. 4–21 ensures that CAM entries remain prioritized by prefix length within a CAM array while minimizing the number of moves required to accomplish CAM entry additions and deletions. As shown by the example of FIG. 3, as long as the CAM entries are sorted by prefix length, the match with the lowest index value will always have the longest prefix length among multiple CAM entry matches.

Figure 4A:
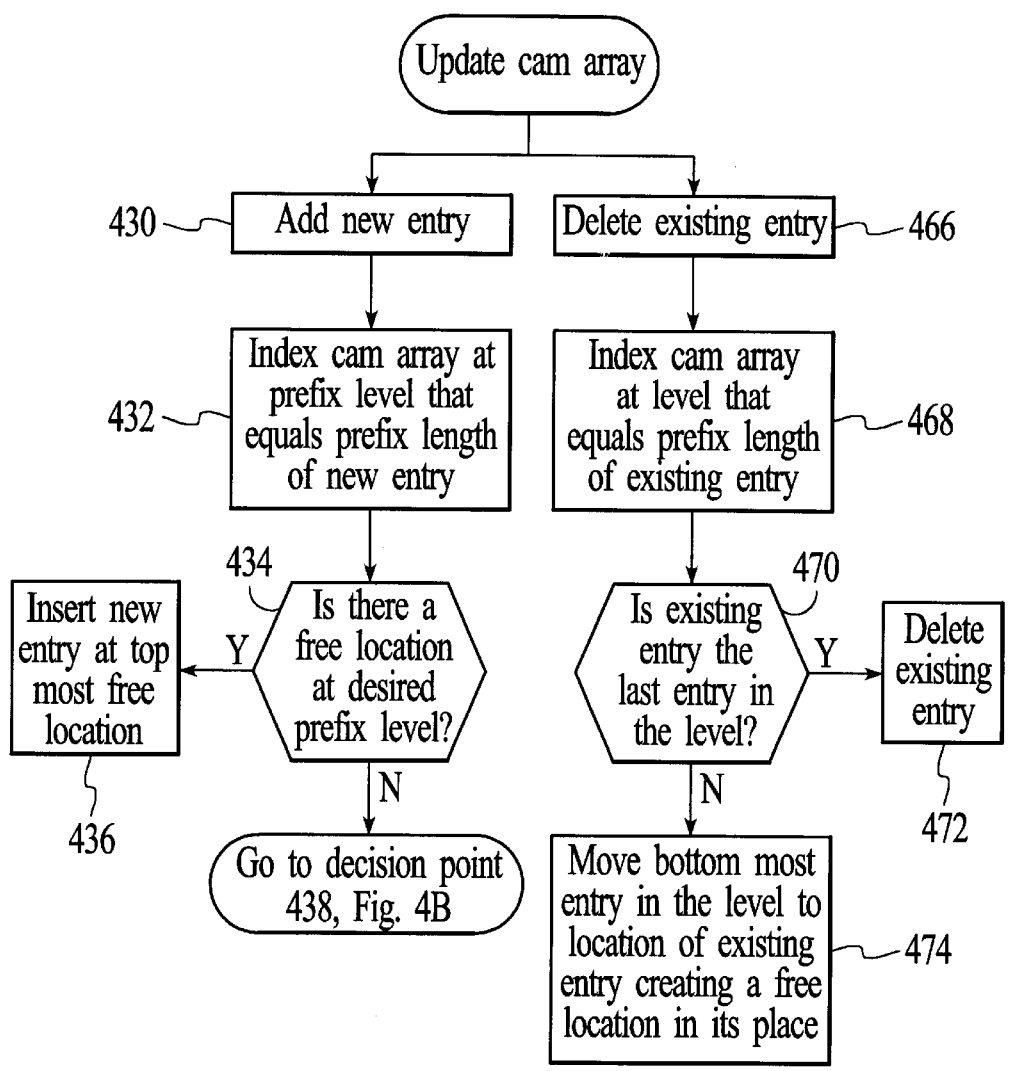
FIGS. 4A and 4B depict a process flow diagram of a method for updating a CAM array in accordance with an embodiment of the invention.
Figure 4B:
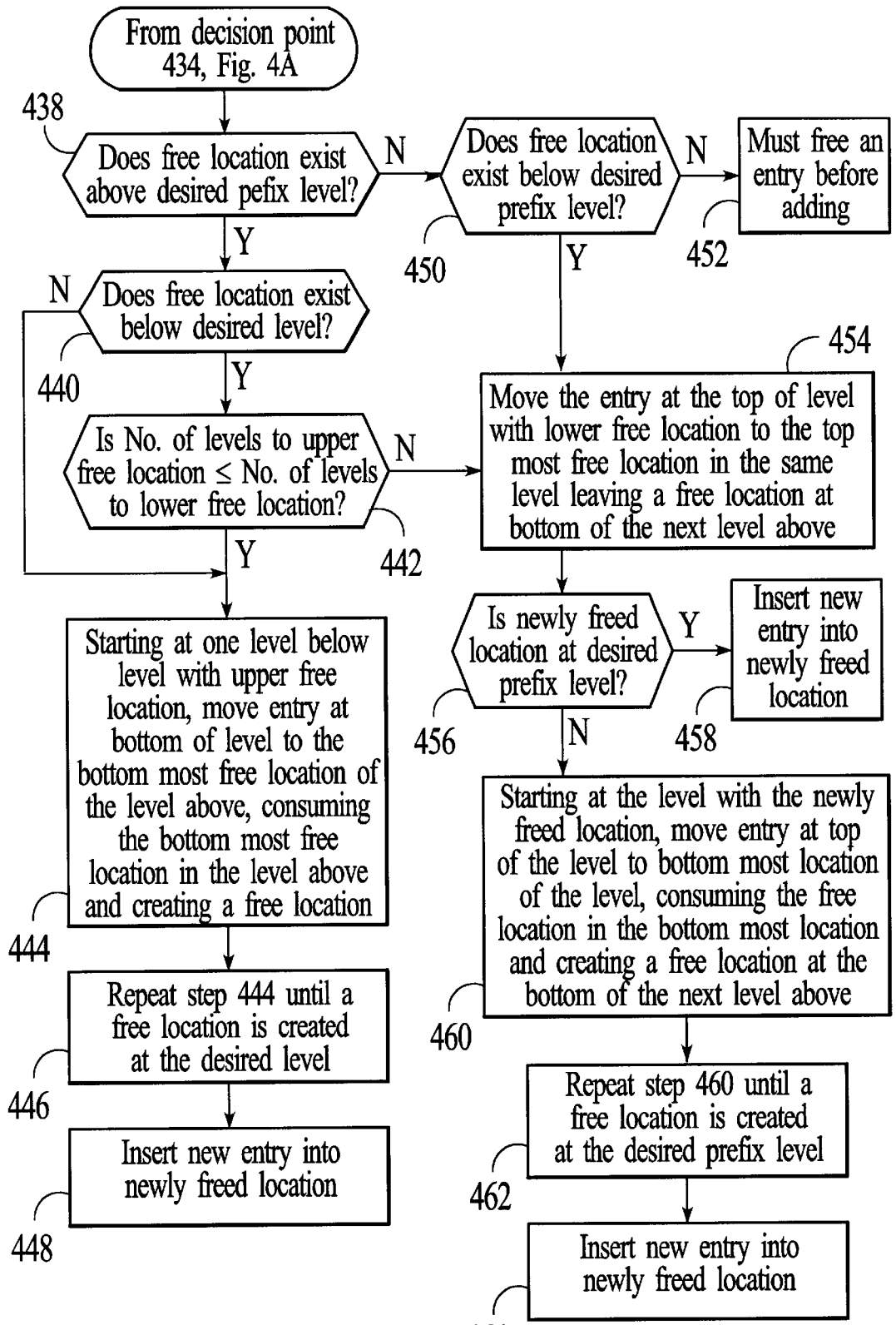

FIGS. 4A and 4B depict a process flow diagram of a method for updating a CAM array that prioritizes CAM entries according to their associated prefix lengths. Updating a CAM array involves adding new entries to the CAM array and deleting existing entries from the CAM array. An algorithm for adding a new entry (step 430) is described first followed by a description of an algorithm for deleting an existing entry. If a new entry is to be added to a CAM array, the CAM array is indexed at the prefix level that equals the prefix length of the new entry (step 432). If there is a free location for the new entry at the desired prefix level (decision point 434), then the new entry is inserted at the top most free location (step 436). If, however, there is not a free location for the new entry at the desired prefix level, then a free location at a different level is sought out.

At decision point 438 (FIG. 4B), it is determined whether a free location exists above the desired prefix level. If a free location exists above the desired prefix level, then at decision point 440, it is determined whether a free location exists below the desired prefix level. If no free location exists below the desired prefix level, then step 444 is performed. Step 444 is described in detail below. If a free location exists below the desired prefix level, then at decision point 442, it is determined whether the number of prefix levels to the upper free location is less than or equal to the number of prefix levels to the lower free location. If the number of prefix levels to the upper free location is less than or equal to the number of prefix levels to the lower free location, then step 444 is performed. If, however, the number of prefix levels to the upper free location is greater than the number of prefix levels to the lower free location, then step 454 is performed. Step 454 and its subsequent steps are described below. If step 444 is to be performed, then starting at one prefix level below the prefix level with the upper free location, move the entry at the bottom of the prefix level to the bottom most free location of the prefix level with the free location (one prefix level above). The move consumes the bottom most free location in the prefix level above and creates a free location in the prefix level from which the entry was moved. If the prefix level of the free location is more than one prefix level away from the desired prefix level, then step 446 requires repeating step 444 until a free location is created at the desired prefix level. Once a free location is created at the desired prefix level, the new entry is inserted into the newly freed location (step 448). Throughout the description, a CAM entry move automatically frees the location from which the entry was moved.

Returning up to decision point 438, if no free location exists above the desired prefix level, then at decision point 450, it is determined whether a free location exists below the desired prefix level. If no free location exists above or below the desired prefix level then a location must be freed before the new entry can be added (step 452). If a free location exists below the desired prefix level, then the entry at the top of the prefix level with the free location is moved (step 454) to the top most free location in the same prefix level. The move creates a free location at the bottom of the next prefix level above. At decision point 456, it is determined whether the newly freed location is at the desired prefix level. If the newly freed location is at the desired prefix level, then the new entry is inserted into the newly freed location (step 458). If, however, the newly freed location is not at the desired prefix level then, at step 460, starting at the prefix level with the newly freed location, the top most entry of the prefix level is moved to the bottom most location (the newly freed location) of the prefix level. The move consumes the free location in the bottom most location and creates a free location at the bottom of the next prefix level above. Step 462 requires repeating step 460 until a free location is created at the desired prefix level. Once a free location is created at the desired prefix level, the new entry is inserted into the newly freed location (Step 464). Utilizing the above-described algorithm to add an entry, the maximum number of moves required to add an entry is thirty-two moves. Thirty-two moves would be required in the worst case where a prefix level thirty-two (/32) entry is to be added and the only free space is at prefix level zero. In contrast, other techniques may require hundreds to thousands of moves to free up a location in a densely populated CAM. In addition to limiting the number of moves required, the above-described algorithm does not utilize bitmaps or linked lists that consume CPU memory.

Referring to FIG. 4A, if an existing entry is to be deleted from a CAM array (step 466), the CAM array is indexed at the prefix level that equals the prefix length of the existing entry (step 468). At decision point 470, it is determined if the existing entry is the last entry in the prefix level. If the existing entry is the last entry in the prefix level, then the existing entry is deleted (step 472). If the existing entry is not the last entry in the prefix level, then the bottom most entry in the prefix level is moved to the location of the existing entry (step 474). The move creates a free location in the place of the entry that was moved. Utilizing the above-described algorithm to delete an entry, the maximum number of moves required to delete an entry is one move.

Utilizing the above-described algorithms for adding and deleting CAM entries ensures that free locations are always maintained at the bottom of the respective prefix level. Although the algorithm described with reference to FIGS. 4A and 4B specifies a particular order for identifying free locations above and below the desired prefix level, the order can be altered such that free locations below are identified before free locations above or such that free locations above and below are identified simultaneously.

FIGS. 5–19 depict example implementations of the method for updating a CAM array that is described with reference to FIGS. 4A and 4B. FIG. 5 depicts a CAM snapshot of eighteen CAM locations that are indexed from 0 to 17. The CAM array is populated with fourteen CAM entries, with each CAM entry including an IP destination address (DA) and a prefix length. The CAM update operation provided in the example of FIGS. 5–7 involves adding a CAM entry to the CAM array. Specifically, the CAM entry 100.1.1.1/23 is to be added to the CAM array. According to the method, the CAM array is indexed (step 432) at prefix level twenty-three (/23). Because there is a free location at the desired prefix level, the new entry is added (step 436) at the free location. FIG. 6 depicts a CAM snapshot of the eighteen CAM locations after the new entry is added at CAM index 7.

FIG. 7 depicts a CAM data structure that represents the change in status of the CAM array from before the addition of the new entry to after the addition of the new entry. The CAM data structure includes the prefix levels that are represented in the CAM array, the total number of locations in each prefix level, the number of entries in each prefix level, and the CAM start index of each prefix level. As shown in FIG. 7, the only field that changes in the CAM data structure after the add operation is the number of entries in the prefix level. Because a CAM entry was added to prefix level twenty-three (/23), the number of entries in the prefix level changed from two to three, however, the total number of locations in the prefix level and the CAM start index of the prefix level did not change. Likewise, no values for the other prefix levels in the CAM data structure were effected by the added entry.

FIGS. 8–10 depict an update operation that involves adding a CAM entry (175.1.1.1/15) to the CAM array, where the initial CAM status shown in FIG. 8 is the same as the initial CAM status shown in FIG. 5. According to the method, the CAM array is indexed (step 432) at prefix level fifteen (/15). Next, it is determined that there is not a free location at the desired prefix level. Because there is not a free location at the desired prefix level, a free location in another prefix level is sought out. Specifically, the free location that is the fewest number of prefix levels away from the desired prefix level is identified. In the example CAM snapshot of FIG. 8, the free location that is the fewest number of prefix levels away from the desired prefix level is at CAM index 7, which is at prefix level twenty-three (/23). According to the method (step 444), the entry at CAM index 8 is moved into the free location at CAM index 7, consuming the free location at CAM index 7 and creating a free location at CAM index 8. The new entry is added in the newly freed location and the prefix level of the location is defined by the new entry. FIG. 9 depicts a CAM snapshot of the eighteen CAM locations after the new entry is added at CAM index 8. In an embodiment, CAM index mapping is updated after each move operation.

FIG. 10 depicts the CAM data structure that represents the change in status of the CAM array from before the addition of the new entry to after the addition of the new entry. As shown in FIG. 10, the total number of locations in prefix level twenty-three (/23) changes from three to two, the CAM start index of prefix level twenty (/20) changes from eight to seven, and at prefix level fifteen (/15), the total number of locations changes from two to three, the number of entries changes from two to three, and the CAM start index changes from nine to eight.

FIGS. 11–13 depict an update operation that involves adding a CAM entry (120.1.2.3/10) to the CAM array, where the initial CAM status shown in FIG. 11 is the same as the initial CAM status shown in FIG. 5. According to the method, the CAM array is indexed (step 432) at prefix level ten (/10) and it is determined that there is not a free location at the desired prefix level. Because there is not a free location at the desired prefix level, a free location in another prefix level is sought out. Specifically, the free location that is the fewest number of prefix levels away from the desired prefix level is identified. In the example CAM snapshot of FIG. 11, the free location that is the fewest number of prefix levels away from the desired prefix level is at CAM index 15, which is at prefix level eight (/8). According to the method (step 454), the entry at the top of the prefix level with the free location (CAM index 13) is moved into the top most free location (CAM index 15) of prefix level eight (/8), consuming the free location at CAM index 15 and creating a free location (CAM index 13) at the bottom of the next level above, prefix level ten (/10). The new entry is added in the newly freed location (CAM index 13). FIG. 12 depicts a CAM snapshot of the eighteen CAM locations after the new entry is added at CAM index 13.

FIG. 13 depicts the CAM data structure that represents the change in status of the CAM array from before the addition of the new entry to after the addition of the new entry. As shown in FIG. 13, the total number of locations at prefix level ten (/10) changes from two to three, the number of entries changes from two to three, and the CAM start index remains the same, and at prefix level eight, the total number of locations changes from three to two and the CAM start index changes from thirteen to fourteen.

FIGS. 14–16 depict an update operation that involves deleting an existing CAM entry (34.2.3.4/10) from the CAM array, where the initial CAM status shown in FIG. 14 is the same as the initial CAM status shown in FIG. 5. According to the method, the CAM array is indexed (step 468) at prefix level ten (/10). Next, it is determined whether or not the existing entry is the last valid entry in the prefix level. Because the entry is the last entry in the prefix level, the existing entry is deleted (step 472). FIG. 15 depicts a CAM snapshot of the eighteen CAM locations after the existing entry at CAM index 12 is deleted.

FIG. 16 depicts the CAM data structure that represents the change in status of the CAM array from before the deletion of the existing entry to after the deletion of the existing entry. As shown in FIG. 16, the number of entries in prefix level ten (/10) changes from two to one and all of the other values in the CAM data structure remain the same.

FIGS. 17–19 depict an update operation that involves deleting an existing CAM entry (40.1.2.1/31) from the CAM array, where the initial CAM status shown in FIG. 17 is the same as the initial CAM status shown in FIG. 5. According to the method, the CAM array is indexed (step 468) at prefix level ten (/31). Next, it is determined whether or not the existing entry is the last valid entry in the prefix level. Because the existing entry is not the last valid entry in the prefix level, the bottom most entry in the same prefix level is moved (step 474) to the location of the existing entry. In the example CAM snapshot of FIG. 17, the bottom most entry in the same prefix level (at CAM index 2) is moved to the location of the existing entry (at CAM index 0). The move operation overwrites the bottom most entry into the location and creates a free location in its place (CAM index 2). FIG. 18 depicts a CAM snapshot of the eighteen CAM locations after the existing entry at CAM index 0 is deleted. Because the bottom most CAM entry is moved, all of the free locations in the prefix level remain at the bottom of the prefix level.

FIG. 19 depicts the CAM data structure that represents the change in status of the CAM array from before the deletion of the existing entry to after the deletion of the existing entry. As shown in FIG. 16, the number of entries in prefix level thirty-one (/31) changes from three to two and all of the other values in the CAM data structure remain the same.

FIGS. 5–19 depict example update operations that involve at most a single move operation. FIGS. 20 and 21 depict example add operations that involve multiple move operations to create a free location at the desired prefix level. FIG. 20 depicts an add operation where the closest free location is at a prefix level that is above the desired prefix level and FIG. 21 depicts an example add operation where the closest free location is at a prefix level that is below the desired prefix level.

Referring to FIG. 20, a new entry needs to be added at prefix level twenty-three (/23). The free location that is the fewest number of prefix levels away from the desired prefix level is at prefix level twenty-nine (/29), four prefix levels above prefix level twenty-three (/23). According to the method for updating CAM arrays that is described herein, the first step involves moving the bottom most entry in prefix level twenty-eight (/28) to the bottom most free location in prefix level twenty-nine (/29). The second step involves moving the bottom most entry in prefix level twenty-seven (/27) to the bottom most free location in prefix level twenty-eight (/28). The third step involves moving the bottom most entry in prefix level twenty-six (/26) to the bottom most free location in prefix level twenty-seven (/27). The fourth step involves inserting the new entry (at prefix level twenty-three, /23) into the newly freed location that was created at step three. The prefix level of the location becomes prefix level twenty-three (/23). As depicted in FIG. 20, the entire operation requires four steps.

Referring to FIG. 21, a new entry needs to be added at prefix level twenty-three (/23) again. The free location that is the fewest number of prefix levels away from the desired prefix level is at prefix level fifteen (/15), four prefix levels below prefix level twenty-three (/23). According to the method for updating CAM arrays that is described herein, the first step involves moving the top most entry in prefix level fifteen (/15) to the top most free location in prefix level fifteen (/15), creating a free location at the bottom of the next level above. The second step involves moving the entry at the top of prefix level sixteen (/16) to the bottom most location of the prefix level, consuming the free location in the bottom of the level and creating a free location at the bottom of the next level above (/20). The third step involves moving the entry at the top of prefix level twenty (/20) to the bottom most location of the prefix level, consuming the free location in the bottom of the level and creating a free location at the bottom of the next level above (/21). The fourth step involves moving the entry at the top of prefix level twenty-one (/21) to the bottom most location of the prefix level, consuming the free location in the bottom of the level and creating a free location at the bottom of the next level above (/27). The fifth step involves inserting the new entry (prefix level twenty-three, /23) into the newly freed location that was created at step four. The prefix level of the location becomes prefix level twenty-three (/23). As depicted in FIG. 20, the entire operation requires five steps.

While FIGS. 20 and 21 provide two examples of add operations, the two examples also illustrate why a free location that is above the desired prefix level is preferred over a free location that is below the desired prefix level when the number of prefix levels to the desired prefix level is the same above as it is below. When the number of prefix levels to the desired prefix level is the same above as it is below, utilizing the free location above requires one fewer step than utilizing the free location below. In the examples of FIGS. 20 and 21, utilizing the free location above requires four steps while utilizing the free location below requires five steps even though the free location is the same number of prefix levels away from the desired prefix level. Since reducing the number of steps (i.e., move operations) is a key aspect of the technique for updating a CAM array, utilizing the free location above the desired prefix level is preferred.

Although the invention is described with reference to updating a layer 3 route table, the algorithms for updating a CAM array can be applied to other data sets, such as layer 2 forwarding tables and address filtering tables.

What is claimed is:

1. A method for updating a content addressable memory (CAM) that prioritizes CAM entries according to their associated prefix lengths, wherein the priority level of CAM entries increases as the prefix length increases and wherein each different prefix length represents a different prefix level within said CAM, said method comprising:
   (a) identifying a new entry that is to be added to said CAM, said new entry having a prefix length and a desired prefix level that is defined by said prefix length;
   (b) identifying a free location in said CAM that is the fewest number of prefix levels away from said desired prefix level;
   (c) moving a first entry into said free location, thereby creating a newly freed location in the former location of said first entry, wherein said newly freed location is a fewer number of prefix levels away from said desired prefix level than said free location;
   (d) repeating step (c) until a free location is created at said desired prefix level; and
   (e) inserting said new entry into said free location that is created at said desired prefix level.

2. The method of claim 1 wherein if said free location is located above said desired prefix level, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

3. The method of claim 1 wherein if said free location is located below said desired level, then step (c) includes moving the entry at the top of the prefix level with the free location to the first free location in the same prefix level, thereby creating a free location at the bottom of the next prefix level above.

4. The method of claim 1 wherein if free locations exist above and below said desired prefix level and the number of prefix levels above and below said desired prefix level is the same, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

5. The method of claim 1 further including:
   identifying an existing entry that is to be deleted from said CAM, said existing entry having a prefix length and a prefix level that is defined by said prefix length;
   determining if said existing entry is the last valid entry in its prefix level;
   if said existing entry is the last valid entry in its prefix level, then deleting said existing entry; and
   if said existing entry is not the last valid entry in its prefix level, then moving the bottom most entry from said prefix level to the location of said existing entry that is to be deleted, thereby writing over said existing entry with said bottom most entry and creating an empty location where said bottom most entry was located before said move.

6. The method of claim 1 wherein said CAM entries include Internet protocol (IP) addresses.

7. The method of claim 1 further including updating a CAM data structure to reflect the insertion of said new entry.

8. A method for updating a content addressable memory (CAM) that prioritizes CAM entries according to their associated prefix lengths, wherein the priority level of CAM entries increases as the prefix length increases and wherein each different prefix length represents a different prefix level within said CAM, said method comprising:
   identifying an existing entry that is to be deleted from said CAM, said existing entry having a prefix length and a prefix level that is defined by said prefix length;
   determining if said existing entry is the last valid entry in its prefix level;
   if said existing entry is the last valid entry in its prefix level, then deleting said existing entry; and
   if said existing entry is not the last valid entry in its prefix level, then moving the bottom most entry from said prefix level to the location of said existing entry that is to be deleted, thereby writing over said existing entry with said bottom most entry and creating an empty location in the place of said bottom most entry.

9. The method of claim 8 further including:
   (a) identifying a new entry that is to be added to said CAM, said new entry having a prefix length and a desired prefix level that is defined by said prefix length;
   (b) identifying a free location in said CAM that is the fewest number of prefix levels away from said desired prefix level;
   (c) moving a first entry into said free location, thereby creating a newly freed location in the former location of said first entry, wherein said newly freed location is a fewer number of prefix levels away from said desired prefix level than said free location;
   (d) repeating step (c) until a free location is created at said desired prefix level; and
   (e) inserting said new entry into said free location that is created at said desired prefix level.

10. The method of claim 9 wherein if said free location is located above said desired prefix level, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

11. The method of claim 9 wherein if said free location is located below said desired level, then step (c) includes moving the entry at the top of the prefix level with the free location to the first free location in the same prefix level, thereby creating a free location at the bottom of the next prefix level above.

12. The method of claim 9 wherein if free locations exist above and below said desired prefix level and the number of prefix levels above and below said desired prefix level is the same, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

13. A method for updating a content addressable memory (CAM) that prioritizes CAM entries according to their associated prefix lengths, wherein the priority level of CAM entries increases as the prefix length increases and wherein each different prefix length represents a different prefix level within said CAM, said method comprising:
- (a) identifying a new entry that is to be added to said CAM, said new entry having a prefix length and a desired prefix level that is defined by said prefix length;
- (b) identifying a free location in said CAM that is the fewest number of prefix levels away from said desired prefix level;
- (c) if said free location is located above said desired level, then moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is closer to said desired prefix level;
- (d) if said free location is located below said desired level, then moving the entry at the top of the prefix level with the free location to the first free location in the same prefix level, thereby creating a free location at the bottom of the next prefix level above;
- (e) repeating step (c) or (d) until a free location at created in said desired prefix level; and
- (f) inserting said new entry into said free location that is created at said desired prefix level.

14. The method of claim 13 including:
identifying an existing entry that is to be deleted from said CAM, said existing entry having a prefix length and a prefix level that is defined by said prefix length;
determining if said existing entry is the last valid entry in its prefix level;
if said existing entry is the last valid entry in its prefix level, then deleting said existing entry; and
if said existing entry is not the last valid entry in its prefix level, then moving the bottom most entry from said prefix level to the location of said existing entry that is to be deleted, thereby writing over said existing entry with said bottom most entry and creating an empty location where said bottom most entry was located before said move.

15. The method of claim 13 further including selecting step (c) over step (d) if free locations exist above and below said desired prefix level and the number of prefix levels above and below said desired prefix level is the same.

16. A system for updating a content addressable memory (CAM) that prioritizes CAM entries according to their associated prefix lengths, wherein the priority level of CAM entries increases as the prefix length increases and wherein each different prefix length represents a different prefix level, said system comprising:
a CAM array for storing CAM entries; and
a CAM array management means, in communication with said CAM array, for;
- (a) identifying a new entry that is to be added to said CAM array, said new entry having a prefix length and a desired prefix level that is defined by said prefix length;
- (b) identifying a free location in said CAM array that is the fewest number of prefix levels away from said desired prefix level;
- (c) moving a first entry into said free location, thereby creating a newly freed location in the former location of said first entry, wherein said newly freed location is a fewer number of prefix levels away from said desired prefix level than said free location;
- (d) repeating step (c) until a free location is created at said desired prefix level; and
- (e) inserting said new entry into said free location that is created at said desired prefix level.

17. The system of claim 16 wherein if said free location is located above said desired prefix level, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

18. The system of claim 16 wherein if said free location is located below said desired level, then step (c) includes moving the entry at the top of the prefix level with the free location to the first free location in the same prefix level, thereby creating a free location at the bottom of the next prefix level above.

19. The system of claim 16 wherein if free locations exist above and below said desired prefix level and the number of prefix levels above and below said desired prefix level is the same, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

20. The system of claim 16 wherein said CAM array management means includes means for:
identifying an existing entry that is to be deleted from said CAM array, said existing entry having a prefix length and a prefix level that is defined by said prefix length;
determining if said existing entry is the last valid entry in its prefix level;
if said existing entry is the last valid entry in its prefix level, then deleting said existing entry from said CAM array; and
if said existing entry is not the last valid entry in its prefix level, then moving the bottom most entry from said prefix level to the location of said existing entry that is to be deleted, thereby writing over said existing entry with said bottom most entry and creating an empty location where said bottom most entry was located before said move.

21. The system of claim 16 wherein said CAM entries include Internet protocol (IP) addresses.

22. The system of claim 16 further including a CAM data structure that is updated to reflect the insertion of said new entry.

23. A computer program product for updating a content addressable memory (CAM) that prioritizes CAM entries according to their associated prefix lengths, wherein the priority level of CAM entries increases as the prefix length increases and wherein each different prefix length represents a different prefix level within said CAM, said computer program product comprising:
computer code for:
- (a) identifying a new entry that is to be added to said CAM, said new entry having a prefix length and a desired prefix level that is defined by said prefix length;
- (b) identifying a free location in said CAM that is the fewest number of prefix levels away from said desired prefix level;

(c) moving a first entry into said free location, thereby creating a newly freed location in the former location of said first entry, wherein said newly freed location is a fewer number of prefix levels away from said desired prefix level than said free location;

(d) repeating step (c) until a free location is created at said desired prefix level; and (e) inserting said new entry into said free location that is created at said desired prefix level.

24. The computer program product of claim 23 wherein if said free location is located above said desired prefix level, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

25. The computer program product of claim 23 wherein if said free location is located below said desired level, then step (c) includes moving the entry at the top of the prefix level with the free location to the first free location in the same prefix level, thereby creating a free location at the bottom of the next prefix level above.

26. The computer program product of claim 23 wherein if free locations exist above and below said desired prefix level and the number of prefix levels above and below said desired prefix level is the same, then step (c) includes moving the bottom entry from a prefix level that is one prefix level below the prefix level with said free location to the bottom most free location of the prefix level with said free location, thereby consuming the bottom most free location in the prefix level with the free location and creating a newly freed location in a prefix level that is a fewer number of prefix levels away from said desired prefix level.

27. The computer program product of claim 23 further including computer code for:

identifying an existing entry that is to be deleted from said CAM, said existing entry having a prefix length and a prefix level that is defined by said prefix length;

determining if said existing entry is the last valid entry in its prefix level;

if said existing entry is the last valid entry in its prefix level, then deleting said existing entry; and if said existing entry is not the last valid entry in its prefix level, then moving the bottom most entry from said prefix level to the location of said existing entry that is to be deleted, thereby writing over said existing entry with said bottom most entry and creating an empty location where said bottom most entry was located before said move.

28. The computer program product of claim 23 wherein said CAM entries include Internet protocol (IP) addresses.

29. The computer program product of claim 23 further including computer code for updating a CAM data structure to reflect the insertion of said new entry.

* * * * *